United States Patent
Lin et al.

(10) Patent No.: US 9,142,671 B2
(45) Date of Patent: Sep. 22, 2015

(54) LATERAL DOUBLE-DIFFUSED METAL OXIDE SEMICONDUCTOR

(75) Inventors: Kwang-Ming Lin, Hsinchu (TW); Ming-Cheng Lin, Taipei (TW); Yu-Long Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 882 days.

(21) Appl. No.: 12/609,813

(22) Filed: Oct. 30, 2009

(65) Prior Publication Data

US 2011/0101453 A1    May 5, 2011

(51) Int. Cl.
  *H01L 29/78*  (2006.01)
  *H01L 21/768*  (2006.01)
  *H01L 23/31*  (2006.01)
  *H01L 29/66*  (2006.01)
  *H01L 29/10*  (2006.01)
  *H01L 29/423*  (2006.01)
  *H01L 29/45*  (2006.01)

(52) U.S. Cl.
  CPC ...... *H01L 29/7835* (2013.01); *H01L 21/76834* (2013.01); *H01L 23/3171* (2013.01); *H01L 29/66659* (2013.01); *H01L 29/1083* (2013.01); *H01L 29/42368* (2013.01); *H01L 29/456* (2013.01); *H01L 2924/0002* (2013.01)

(58) Field of Classification Search
  USPC .............................................. 257/328; 81/328
  See application file for complete search history.

(56) References Cited

U.S. PATENT DOCUMENTS

| | | | | |
|---|---|---|---|---|
| 2002/0053695 A1* | 5/2002 | Liaw et al. | ..... | 257/328 |
| 2004/0063291 A1* | 4/2004 | Williams et al. | ..... | 438/309 |
| 2007/0063274 A1* | 3/2007 | Kanda et al. | ..... | 257/335 |
| 2009/0321875 A1* | 12/2009 | Chang | ..... | 257/520 |
| 2010/0123196 A1* | 5/2010 | Cho | ..... | 257/343 |

OTHER PUBLICATIONS

J. A. Rossi, Robert K. Willardson, Eicke R. Weber, Danilo Crippa, Daniel L. Rode, Silicon Epitaxy vol. 72 of Semiconductors and semimetals, ISSN 0080-8784, Academic Press, 2001, pp. 38-39.*

\* cited by examiner

*Primary Examiner* — David Vu
*Assistant Examiner* — Jonathan Han (57) ABSTRACT

The invention provides a lateral double-diffused metal oxide semiconductor (LDMOS). The pre-metal dielectric layer (PMD) of the LDMOS is a silicon rich content material. Additionally, the inter-layer dielectric layer (ILD), inter-metal dielectric layer (IMD), or protective layer of the LDMOS may be formed of a silicon rich content material.

10 Claims, 8 Drawing Sheets

LATERAL DOUBLE-DIFFUSED METAL OXIDE SEMICONDUCTOR

BACKGROUND OF THE INVENTION

1. Field of the Invention

The present invention relates to lateral double diffused MOSFETs, and in particular relates to lateral double diffused MOSFETs with a silicon rich content dielectric layer.

2. Description of the Related Art

The advantages of high power integrated circuits include high resistance for high voltage and low conductive resistance. Because of the advantages of high power integrated circuits, it has been widely used in display driver IC devices, power supply IC devices, the communications fields, etc.

Conventional high power devices are provided with vertical double diffused MOSFETs (VDMOSFETs) and lateral double diffused MOSFETs (LDMOSFETs), wherein a double diffused MOSFET is a representative lateral structure and a trench power transistor is a representative vertical structure. The operation of the high power devices is the same as conventional MOSs, wherein a gate electrode is used as an external voltage to form an inverted layer below the gate electrode, thus allowing the inverted layer to connect to a source region and a drain region by forming a channel.

The operating efficiency of transistors can be improved by maintaining the threshold-voltage (Vth) stability of an LDMOS. However, for an LDPMOS, shifts in threshold voltage of LDPMOSs are a serious problem. While reduction of threshold voltage shifts has been disclosed by controlling the doping concentration of a gate oxide layer, the method does not completely mitigate the problem efficiently.

Accordingly, there is a need to develop a method for efficiently reducing threshold voltage shift.

BRIEF SUMMARY OF THE INVENTION

The invention provides a lateral double-diffused metal oxide semiconductor (LDMOS), comprising: a semiconductor substrate; a p-epitaxial layer formed on the semiconductor substrate; a p-well formed on the p-epitaxial layer; a plurality of isolation structures formed on the p-well; an n-doped buried layer formed in the p-epitaxial layer; a first high voltage n-well, a second high voltage n-well and a high voltage p-well formed on the n-doped buried layer, wherein the high voltage p-well is between the first high n-well and the second high voltage n-well; a pair of source regions formed on the first high voltage n-well; a drain region formed on the high voltage p-well; a gate dielectric layer formed on the first high voltage n-well and the high voltage p-well; a gate electrode formed on the gate dielectric layer; and a pre-metal dielectric layer formed on the source regions, the gate electrode, the isolation structures and the drain region, wherein the pre-metal dielectric layer is a silicon rich content material with silicon content higher than that according to silicon content of the stoichiometric composition formula.

The invention provides a lateral double-diffused metal oxide semiconductor (LDMOS), comprising: a semiconductor substrate; a p-epitaxial layer formed on the semiconductor substrate; a p-well formed on the p-epitaxial layer; a plurality of isolation structures formed on the p-well; an n-doped buried layer formed in the p-epitaxial layer; a first high voltage n-well, a second high voltage n-well and a third high voltage n-well formed on the n-doped buried layer; a first high voltage p-well and a second high voltage p-well formed on the n-doped buried layer, wherein the first high voltage p-well is between the first high voltage n-well and the second high voltage n-well, the second high voltage p-well is between the second high voltage n-well and the third high voltage n-well; a source region formed on the first high voltage p-well; a pair of drain regions formed on the second high voltage p-well and the third high voltage n-well; a gate dielectric layer formed on the second high voltage n-well, the first high voltage p-well and the second high voltage p-well; a gate electrode formed on the gate dielectric layer; and a pre-metal dielectric layer formed on the on the source region, the gate electrode, the isolation structures and the drain regions, wherein the pre-metal dielectric layer is a silicon rich content material with silicon content higher than that according to silicon content of the stoichiometric composition formula.

A detailed description is given in the following embodiments with reference to the accompanying drawings.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
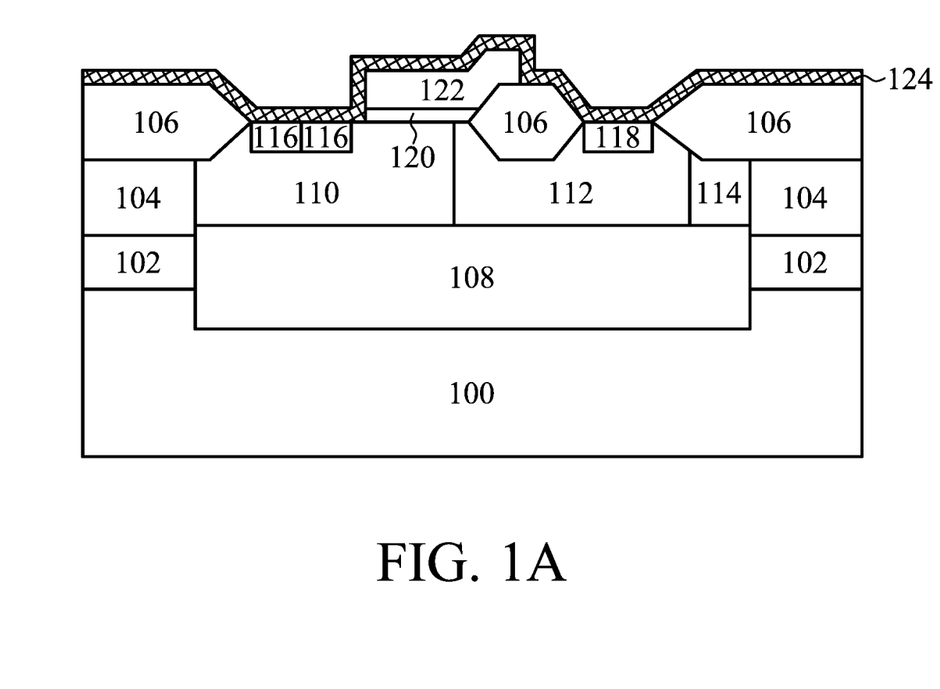
FIGS. 1A-1D show a cross-sectional schematic representation of a asymmetric lateral double-diffused metal oxide semiconductor of the invention.

The first embodiment of the invention is an asymmetric lateral double-diffused metal oxide semiconductor (LDPMOS). Referring to FIG. 1, firstly a semiconductor substrate 100 is provided, such as a bulk silicon or silicon-on-insulator (SOI) semiconductor substrate. A p-epitaxial layer 102 is formed on the semiconductor substrate 100. The p-epitaxial layer 102 is formed by using boron as a dopant to form an amorphous silicon by a chemical vapor deposition process, then a solid phase epitaxy (SPE) step is performed. A p-well 104 is formed on the p-epitaxial layer 102, which is formed by application and development of a patterned mask (not shown), and then implantation with a p-type dopant, such as boron, gallium, aluminum, indium or combinations thereof. A plurality of isolation structures 106 are formed on the p-well 104. The isolation structures 106 may be field oxide (FOX) or shallow trench isolation (STI) isolation structures and comprise silicon oxide.

An n-doped buried layer 108 is formed in the p-epitaxial layer 102. The n-type dopants such as phosphorous, arsenic, nitrogen, antimony or combinations thereof are implanted into the p-epitaxial layer 102 to form the n-doped buried layer 108. A first high voltage n-well 110 and a second high voltage n-well 114 are formed on the n-doped buried layer 108, which are formed by application and development of a patterned mask (not shown), and then implantation with an n-type dopant. Next, a high voltage p-well 112 is formed on the n-doped buried layer 108, which is formed by application and development of a patterned mask (not shown), and then implantation with a p-type dopant. The high voltage p-well 112 is between the first high voltage n-well 110 and the second high voltage n-well 114.

A pair of source regions 116 is formed on the first high voltage n-well 110, and a drain region 118 is formed on the high voltage p-well 112. A gate dielectric layer 120 is formed on the high voltage p-well 112 and the first high voltage n-well 110. The gate dielectric layer 120 comprises oxide, nitride, oxynitride or high-k material. The gate dielectric layer 120 is deposited by a low temperature chemical vapor deposition (LTCVD), low pressure chemical vapor deposition (LPCVD), rapid thermal chemical vapor deposition (RTCVD) or chemical vapor deposition (CVD) process. A gate electrode 122 such as polysilicon, metal, alloy or silicide is formed on the gate dielectric layer 120.

Note that an important step in the present invention is to deposit a pre-metal layer (PMD) 124 on the isolation structures 106, source regions 116 and drain region 118. Also note that the PMD 124 is a silicon rich content material which comprises silicon dioxide, silicon oxynitride, silicon nitride or combinations thereof, wherein the silicon content is higher than that according to the silicon content of the stoichiometric composition formula.

At the back-end-of-line (BEOL) of the LDMOS, when the inter-layer dielectric layer (ILD) or inter-metal dielectric layer (IMD) is being deposited by the chemical vapor deposition process, a large amount of hydrogen is produced because silane compounds are introduced into the processes. Furthermore, during the cleaning processes, a large amount of water is introduced into the LDMOS structure. If the hydrogen and water produced by the above processes diffuse into the channel, carrier flow may be inhibited, further causing threshold voltage shifts and effecting device efficiency. The above mentioned situation is especially serious in LDPMOSs. For prior art, silicon dioxide ($SiO_2$) or silicon nitride ($Si_3N_4$) are used as a PMD layer. But, the materials can not effectively prevent hydrogen and water from diffusing into the channels between source region and drain region. Therefore, the invention provides a method for depositing silicon rich content material in PMD to prevent the hydrogen and water from diffusing into the channels between source region and drain region.

Thus, the main difference between prior art use of silicon dioxide ($SiO_2$) or silicon nitride ($Si_3N_4$) and the invention when forming dielectric layers is the use of silicon rich content material for the invention. When silicon oxide is used as a dielectric layer, an atomic ratio of silicon to oxygen is about (1.1-1.5): 2, and has a refractive index of about 1.5-1.7. When a highly selective silicon nitride is used as a dielectric layer, an atomic ratio of silicon to nitrogen is about (3.1-3.5): 4. Additionally, the silicon rich content further comprises a dopant, such as boron, phosphorus, germanium or combinations thereof.

The silicon rich content material is formed by atmospheric pressure chemical vapor deposition (APCVD) or plasma enhanced chemical vapor deposition (PECVD). In one embodiment, a silicon dioxide layer is formed by purging a silicon-containing gas, such as silane ($SiH_4$), disilane ($Si_2H_6$) or tetraethoxy silane ($Si(OC_2H_5)_4$), and oxygen. A dopant such as boron, phosphorous, germanium could also be selectively purged. The flow of the oxygen to the silicon-containing gas is controlled to be between about 1.2-12 to obtain the silicon rich content silicon oxide.

In one embodiment, the highly selective silicon nitride layer is formed by purging a silicon-containing gas, such as silane ($SiH_4$), disilane ($Si_2H_6$) or tetraethoxy silane ($Si(OC_2H_5)_4$), and a nitrogen-containing gas such as nitrogen gas ($N_2$) or ammonia ($NH_3$). The flow of the nitrogen-containing gas to the silicon-containing gas is controlled to be between about 0.25-0.75 to obtain the silicon rich content silicon nitride.

The PMD layer of the invention with silicon rich content prevents the hydrogen and water from diffusing into the channels between source region and drain region, and further improves stability of the threshold voltage.

Figure 1B:
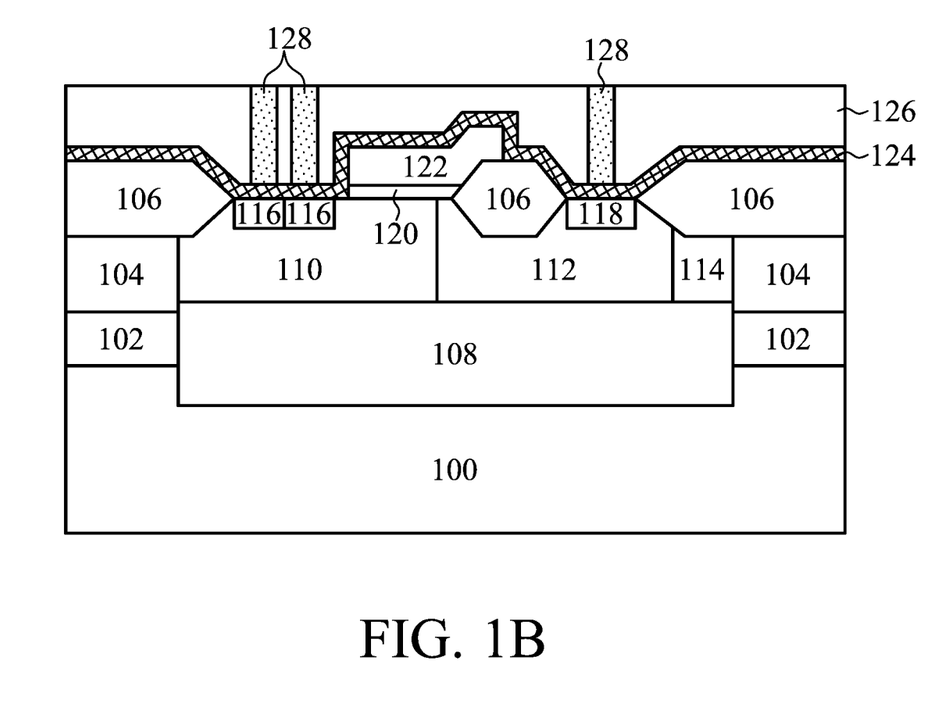

As shown in FIG. 1B, a inter-layer dielectric layer (ILD) 126 is deposited on the PMD layer 124, wherein the ILD 126 is also a silicon rich content material. Next, a plurality of metal plugs 128 are formed on the source region 116 and drain region 118 by contact via processes.

Figure 1C:
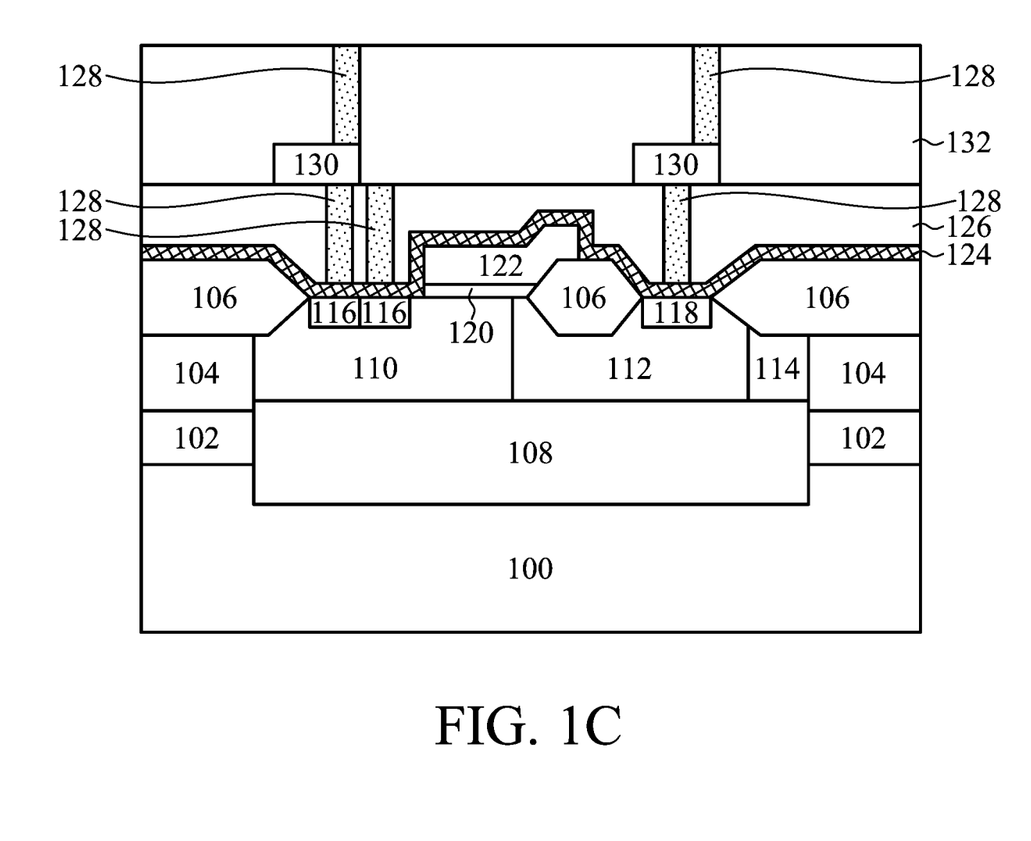

Referring to FIG. 1C, a metal line 130 is formed on the metal plug 128, then an inter-metal dielectric layer (IMD) 132 is formed on the metal line 130, wherein the IMD 132 is also a silicon rich content material. Alternatively, it should be understood by those skilled in the art that more than one layer of metal plugs and IMDs may be formed.

Figure 1D:
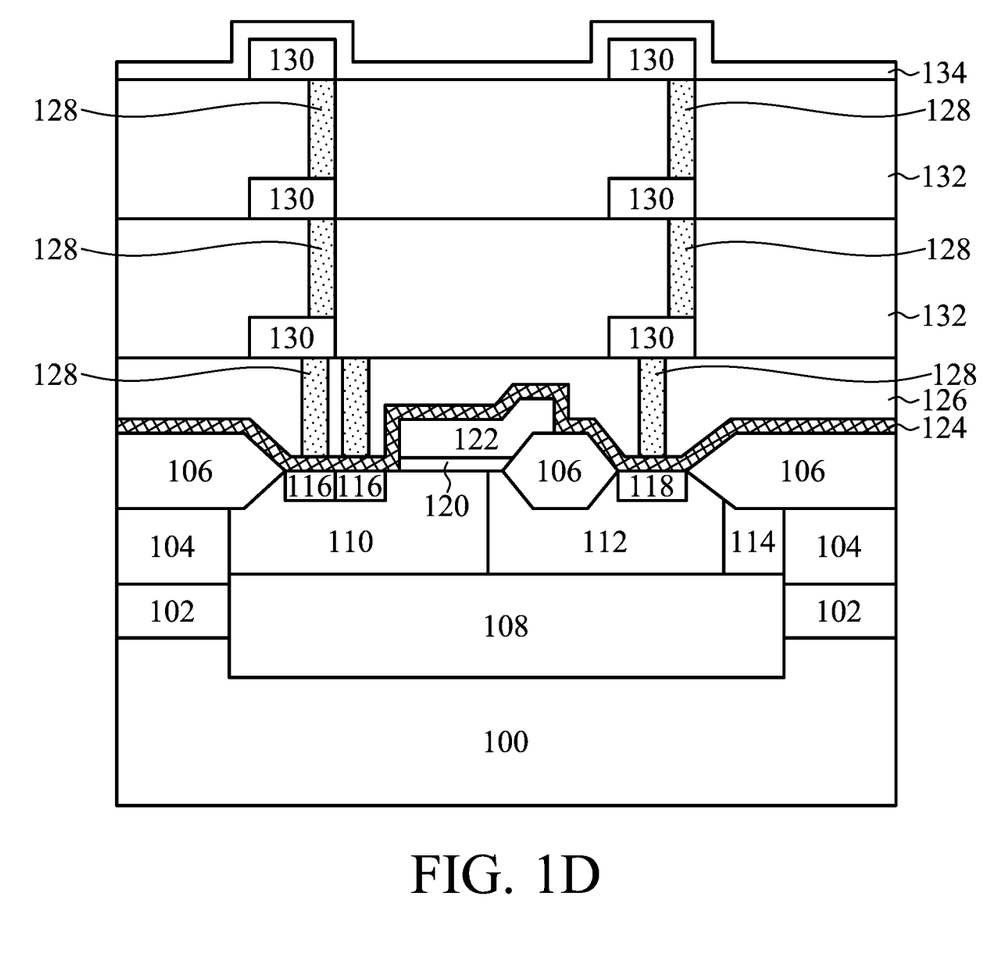

As indicated in FIG. 1D, a protective layer 134 is formed on the final metal line 130. It should be noted that the protective layer 134 is also a silicon rich content material, which effectively prevents hydrogen and water from diffusing into the channels between source region and drain region, and further improves stability of the threshold voltage.

Figure 1E:
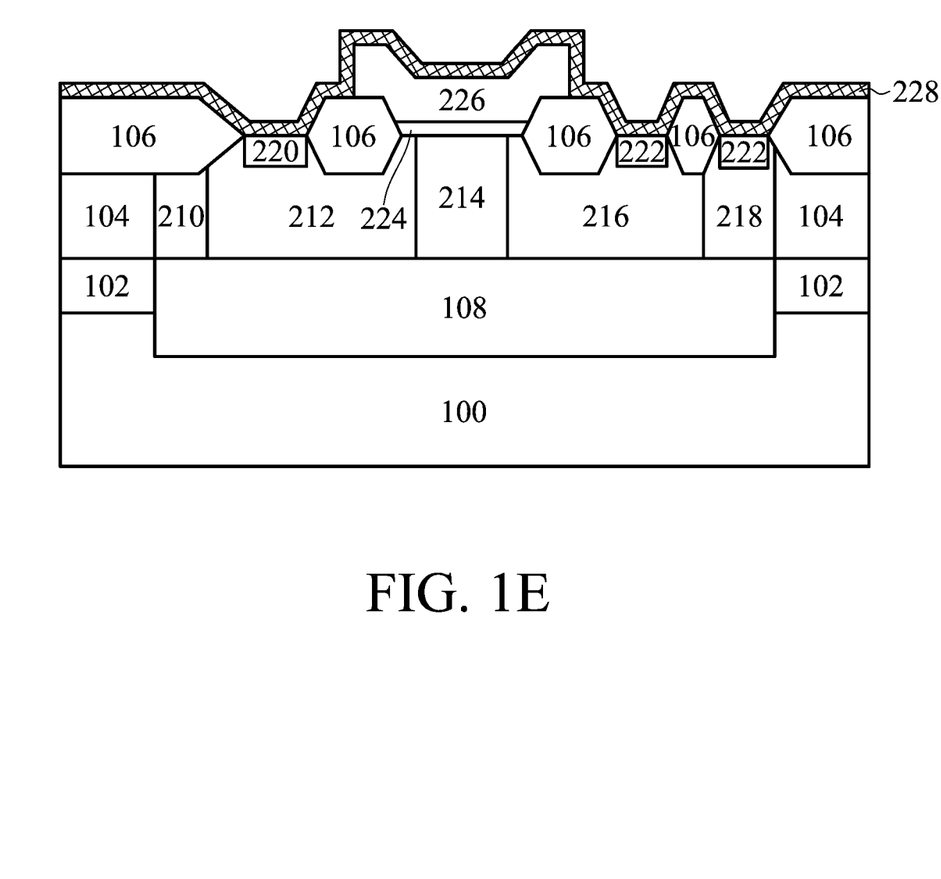
FIGS. 1E-1H show a cross-sectional schematic representation of a symmetric lateral double-diffused metal oxide semiconductor of the invention.

A second embodiment of the invention is described in FIG. 1E, wherein a symmetric lateral double-diffused metal oxide semiconductor is provided. The reference numbers 100-108, which are the same as that in the first embodiment are omitted. The differences between the two embodiments are as follows. A first high voltage n-well 210, a second high voltage n-well 214 and a third high voltage n-well 218 are formed on the n-doped buried layer 108. The above mentioned n-well is formed by application and development of a patterned mask (not shown), and then implantation with an n-type dopant. Next, a first high voltage p-well 212 and a second high voltage p-well 216 are formed on the n-doped buried layer 108. The above mentioned p-well is formed by application and development of a patterned mask (not shown), and then implantation with a p-type dopant. The first high voltage p-well 212 is between the first high voltage n-well 210 and the second high voltage n-well 214, and the second high voltage p-well 216 is between the second high voltage n-well 214 and the third high voltage n-well 218.

A source region 220 is formed on the first high voltage p-well 212, and a pair of drain regions 222 is formed on the second high voltage p-well 216 and the third high voltage n-well 218. A gate dielectric layer 224 is formed on the first high voltage p-well 212, the second high voltage n-well 214 and the second high voltage p-well 216. The gate dielectric layer 224 comprises oxide, nitride, oxynitride or high-k material. The gate dielectric layer 224 is deposited by a low temperature chemical vapor deposition (LTCVD), low pressure chemical vapor deposition (LPCVD), rapid thermal chemical vapor deposition (RTCVD) or chemical vapor deposition (CVD) process. A gate electrode 226 such as polysilicon, metal, alloy or silicide is formed on the gate dielectric layer 224.

Note that an important step in the present invention to deposit a pre-metal layer (PMD) 228 to be conformally formed on the isolation structures 106, source region 220 and drain regions 222. It should be noted that the PMD 228 is a silicon rich content material which comprises silicon dioxide, silicon oxynitride, silicon nitride or combinations thereof, wherein the silicon content is higher than that according to the silicon content of the stoichiometric composition formula. When silicon oxide is used as a dielectric layer, an atomic ratio of silicon to oxygen is about (1.1-1.5): 2, and has a refractive index about 1.5-1.7. When the highly selective silicon nitride is used as a dielectric layer, an atomic ratio of silicon to nitrogen is about (3.1-3.5): 4. Additionally, the silicon rich content further comprises a dopant, such as boron, phosphorus, germanium or combinations thereof. The method for forming the silicon rich content material is the same as that in the first embodiment.

Figure 1F:
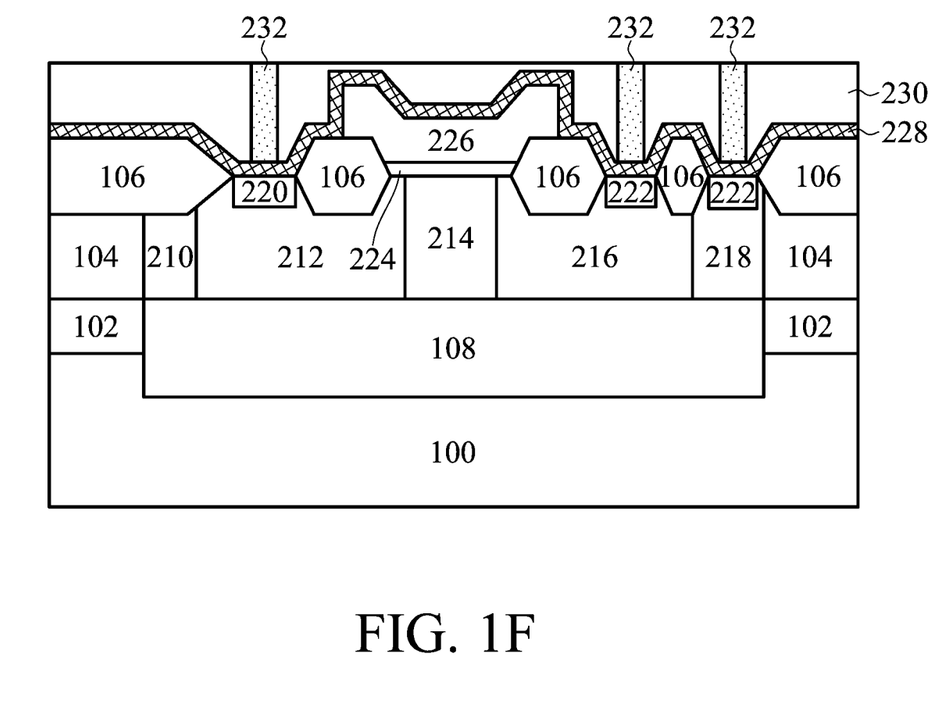

Referring to FIG. 1F, an inter-layer dielectric layer (ILD) 230 is formed on the PMD 228, wherein the ILD 230 is also a silicon rich content material. Next, a plurality of metal plugs 232 are formed on the source region 220 and drain regions 222 by contact via processes.

Figure 1G:
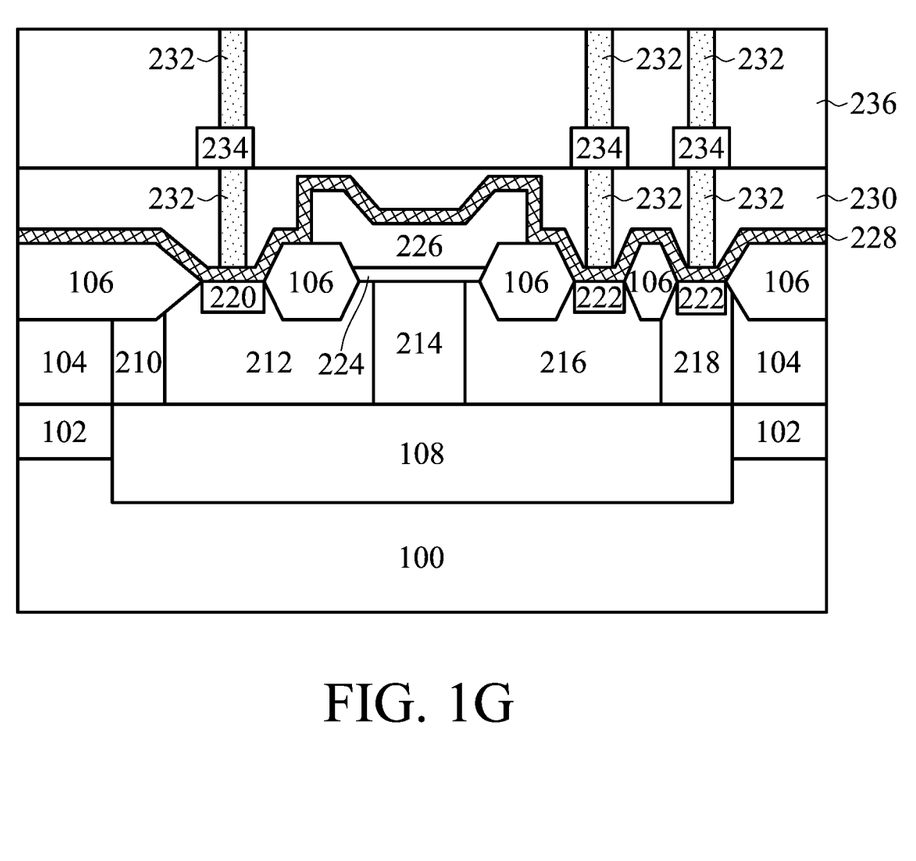

As shown in FIG. 1G, a metal line 234 is formed on the metal plug 232, then an inter-metal dielectric layer (IMD) 236 is formed on the metal line 234, wherein the IMD 236 is also a silicon rich content material. Alternatively, it should be understood by those skilled in the art that more than one layer of metal plugs and IMD may be formed.

Figure 1H:
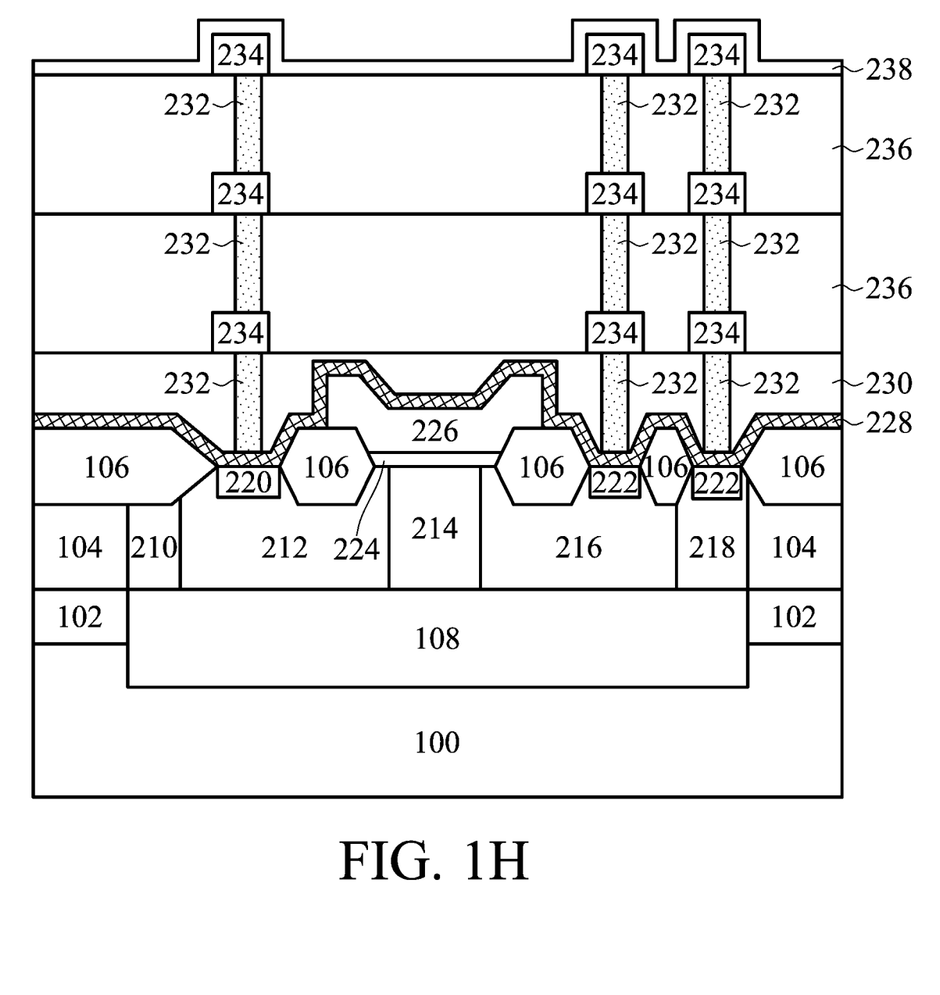

As indicated in FIG. 1H, a protective layer 238 is formed on the final metal line 234. It should be noted that the protective layer 238 is also a silicon rich content material, which effectively prevents hydrogen and water from diffusing into the channels between source region and drain region and further improves stability of the threshold voltage.

The above mentioned PMD, ILD, IMD or protective layers are not limited to being one layer, and more than one layer may be deposited to effectively prevent hydrogen and water from diffusing into the channels between source region and drain region.

The lateral double-diffused metal oxide semiconductor of the invention is provided, wherein the PMD is a silicon rich content material, and alternatively, an ILD, IMD or protective layer may be formed of the silicon rich content material. The silicon rich content material not only prevents hydrogen and water from diffusing into the channels between source region and drain region but also improves stability of the threshold voltage.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral double-diffused metal oxide semiconductor (LDMOS), comprising:
    a semiconductor substrate;
    a p-epitaxial layer formed on the semiconductor substrate;
    a p-well formed on the p-epitaxial layer;
    a plurality of isolation structures formed on the p-well;
    an n-doped buried layer formed in the p-epitaxial layer;
    a first high voltage n-well, a second high voltage n-well and a high voltage p-well formed on the n-doped buried layer, wherein the high voltage p-well is between the first high n-well and the second high voltage n-well;
    a pair of source regions formed on the first high voltage n-well;
    a drain region formed on the high voltage p-well;
    a gate dielectric layer formed on the first high voltage n-well and the high voltage p-well;
    a gate electrode formed on the gate dielectric layer;
    a pre-metal dielectric layer conformally formed on the source regions, the gate electrode, the isolation structures and the drain region, wherein the pre-metal dielectric layer is a silicon rich content material with silicon content higher than that according to silicon content of the stoichiometric composition formula, wherein the silicon rich content material comprises silicon oxide, silicon oxynitride, silicon nitride or combinations thereof, and an atomic ratio of silicon to oxygen of the silicon oxide is about (1.1-1.5): 2;
    an inter-layer dielectric layer formed on the pre-metal dielectric layer; and
    a plurality of metal plugs extending through the inter-layer dielectric layer.

2. The lateral double-diffused metal oxide semiconductor as claimed in claim 1, wherein the silicon oxide has a refractive index between the range of about 1.5 to about 1.7.

3. The lateral double-diffused metal oxide semiconductor as claimed in claim 1, wherein an atomic ratio of silicon to nitrogen of the silicon nitride is about (3.1-3.5):4.

4. The lateral double-diffused metal oxide semiconductor as claimed in claim 1, wherein the silicon rich content material further comprises a dopant.

5. The lateral double-diffused metal oxide semiconductor as claimed in claim 4, wherein the dopant comprises boron, phosphorus, germanium and combinations thereof.

6. The lateral double-diffused metal oxide semiconductor as claimed in claim 1, wherein the silicon rich content material is formed by atmospheric pressure chemical vapor deposition or plasma enhanced chemical vapor deposition.

7. The lateral double-diffused metal oxide semiconductor as claimed in claim 1, wherein the inter-layer dielectric layer is a silicon rich content material.

8. The lateral double-diffused metal oxide semiconductor as claimed in claim 7, further comprising:
    a plurality of inter-layer dielectric layers formed on the inter-layer dielectric layer, wherein the inter-layer dielectric layers are a silicon rich content material.

9. The lateral double-diffused metal oxide semiconductor as claimed in claim 8, further comprising:
    a protective layer formed on the inter-layer dielectric layers, wherein the protective layer is a silicon rich content material.

10. The lateral double-diffused metal oxide semiconductor as claimed in claim 1, wherein the source regions, the gate electrode, the isolation structures and the drain region are between the pre-metal dielectric layer and the semiconductor substrate.

* * * * *